(12) United States Patent
Tuominen et al.

(10) Patent No.: US 8,817,485 B2
(45) Date of Patent: *Aug. 26, 2014

(54) SINGLE-LAYER COMPONENT PACKAGE

(75) Inventors: Risto Tuominen, Espoo (FI); Petteri Palm, Helsinki (FI)

(73) Assignee: GE Embedded Electronics Oy, Helsinki (FI)

( * ) Notice: Subject to any disclaimer, the term of this patent is extended or adjusted under 35 U.S.C. 154(b) by 210 days.

This patent is subject to a terminal disclaimer.

(21) Appl. No.: 12/603,324

(22) Filed: Oct. 21, 2009

(65) Prior Publication Data

US 2010/0103635 A1    Apr. 29, 2010

Related U.S. Application Data (63) Continuation-in-part of application No. 11/907,795, filed on Oct. 17, 2007, now Pat. No. 7,609,527, which is a continuation of application No. 10/546,820, filed as application No. PCT/FI2004/000101 on Feb. 25, 2004, now Pat. No. 7,299,546.

(30) Foreign Application Priority Data

Feb. 26, 2003  (FI) ..................................... 20030292

(51) Int. Cl.
*H05K 1/18* (2006.01)
*H05K 7/12* (2006.01)

(52) U.S. Cl.
USPC ........... 361/761; 361/763; 361/764; 361/767; 361/768

(58) Field of Classification Search
USPC ......... 361/760, 761, 763, 764, 767, 768, 771, 361/783, 800
See application file for complete search history.

(56) References Cited

U.S. PATENT DOCUMENTS

| | | | |
|---|---|---|---|
| 3,480,836 A | | 11/1969 | Aronstein |
| 3,931,922 A | | 1/1976 | Jackson et al. |
| 3,942,245 A | | 3/1976 | Jackson et al. |
| 3,996,412 A | * | 12/1976 | Schaefer et al. ............... 373/128 |
| 4,102,039 A | | 7/1978 | Henrickson et al. |
| 4,246,595 A | | 1/1981 | Noyori et al. |
| 4,835,846 A | | 6/1989 | Juan et al. |
| 5,042,145 A | | 8/1991 | Boucquet et al. |
| 5,833,355 A | * | 11/1998 | You et al. ...................... 362/244 |
| 6,038,133 A | | 3/2000 | Nakatani et al. |
| 6,154,366 A | | 11/2000 | Ma et al. |
| 6,250,541 B1 | * | 6/2001 | Shangguan et al. .......... 228/208 |
| 6,271,469 B1 | | 8/2001 | Ma et al. |
| 6,489,685 B2 | | 12/2002 | Asahi et al. |
| 6,538,210 B2 | | 3/2003 | Sugaya et al. |

(Continued)

FOREIGN PATENT DOCUMENTS

| | | |
|---|---|---|
| DE | 44 24 396 A1 | 1/1996 |
| EP | 0611129 A2 | 8/1994 |

(Continued)

*Primary Examiner* — Hoa C Nguyen (74) *Attorney, Agent, or Firm* — Seppo Laine Oy; Joshua P. Wert (57) ABSTRACT

A single-layer component package comprising: a single conductive-pattern layer having a first surface; an insulating-material layer on the first surface of the single conductive-pattern layer; in an installation cavity inside the insulating-material layer, a semiconductor component having flat contact zones; and solid contact pillars containing copper and solderlessly, metallurgically and electrically connecting the flat contact zones to the single conductive-pattern layer.

22 Claims, 8 Drawing Sheets

(56) References Cited

U.S. PATENT DOCUMENTS

| | | | |
|---|---|---|---|
| 6,548,330 B1 * | 4/2003 | Murayama et al. | 438/127 |
| 6,600,231 B2 | 7/2003 | Tominaga | |
| 6,664,130 B2 | 12/2003 | Akram | |
| 6,690,583 B1 * | 2/2004 | Bergstedt et al. | 361/763 |
| 6,798,121 B2 | 9/2004 | Nakatani et al. | |
| 6,908,794 B1 * | 6/2005 | Chiang | 438/123 |
| 6,984,576 B1 * | 1/2006 | Lin et al. | 438/611 |
| 7,003,864 B2 * | 2/2006 | Dirscherl | 29/527.2 |
| 2001/0037896 A1 | 11/2001 | Asai et al. | |
| 2002/0039807 A1 * | 4/2002 | Koyama | 438/106 |
| 2002/0081768 A1 | 6/2002 | Yoshida | |
| 2002/0117743 A1 | 8/2002 | Nakatani et al. | |
| 2003/0068852 A1 | 4/2003 | Towle et al. | |
| 2003/0090883 A1 | 5/2003 | Asahi et al. | |
| 2003/0121692 A1 | 7/2003 | Kato et al. | |
| 2003/0137045 A1 | 7/2003 | Sugaya et al. | |
| 2003/0141105 A1 * | 7/2003 | Sugaya et al. | 174/256 |
| 2003/0159849 A1 | 8/2003 | Wermelinger | |
| 2003/0159852 A1 * | 8/2003 | Nakamura | 174/255 |
| 2003/0188885 A1 | 10/2003 | Niinobe et al. | |
| 2004/0026112 A1 | 2/2004 | Goldworthy et al. | |
| 2005/0000729 A1 | 1/2005 | Iljima et al. | |

FOREIGN PATENT DOCUMENTS

| | | |
|---|---|---|
| GB | 2204184 A | 11/1988 |
| JP | 9270583 A | 10/1997 |
| JP | 2001-53447 A | 2/2001 |
| JP | 2001210955 A | 8/2001 |
| JP | 2001332654 A | 11/2001 |
| JP | 2002158258 A | 5/2002 |
| JP | 2002158450 A | 5/2002 |
| JP | 2002184812 A | 6/2002 |
| JP | 280204057 A | 7/2002 |
| JP | 2002246536 A | 8/2002 |
| JP | 2002290044 A | 10/2002 |
| WO | WO-96/02042 A1 | 1/1996 |

* cited by examiner

SINGLE-LAYER COMPONENT PACKAGE

This application is a Continuation-In-Part of copending application Ser. No. 11/907,795 filed on Oct. 17, 2007; which claims priority under 35 U.S.C. 120 to U.S. application Ser. No. 10/546,820 filed on Aug. 25, 2008 which is the National Phase of PCT/FI2004/000101, filed Feb. 25, 2004 and further claims priority under 35 U.S.C. 119(a) to Patent Application No. 20030292 filed in Finland on Feb. 26, 2003. All of these prior applications are hereby expressly incorporated by reference into the present application.

The present invention relates to a single-layer component package.

In particular, the invention relates to a single-layer component package, which includes one or more components embedded in an installation base. The single-layer component package can be a module, which includes several components, which are connected to each other electrically, through conducting structures manufactured in the module. The components can be passive components, microcircuits, semiconductor components, or other similar components. The single-layer component packages to which the invention relates can, of course, also include other types of components.

The installation base can be of a type similar to the bases that are generally used in the electronics industry as installation bases for electrical components. The task of the base is to provide components with a mechanical attachment base and the necessary electrical connections to both components that are on the base and those that are outside the base. The installation base can be a circuit board, in which case the construction and method to which the invention relates are closely related to the manufacturing technology of circuit boards. The installation base may also be some other base, for example, a base used in the packaging of a component or components, or a base for an entire functional module.

The manufacturing techniques used for circuit boards differ from those used for microcircuits in, among other things, the fact that the installation base in microcircuit manufacturing techniques, i.e. the substrate, is of a semiconductor material, whereas the base material of an installation base for circuit boards is some form of insulating material. The manufacturing techniques for microcircuits are also typically considerably more expensive that the manufacturing techniques for circuit boards.

The constructions and manufacturing techniques for the cases and packages of components, and particularly semiconductor components differ from the construction and manufacture of circuit boards, in that component packaging is primarily intended to form a casing around the component, which will protect the component mechanically and facilitate the handling of the component. On the surface of the component, there are connector parts, typically protrusions, which allow the packaged component to be easily set in the correct position on the circuit board and the desired connections to be made to it. In addition, inside the component case, there are conductors, which connect the connector parts outside the case to connection zones on the surface of the actual component, and through which the component can be connected as desired to its surroundings.

However, component cases manufactured using conventional technology demand a considerable amount of space. As electronic devices have grown smaller, there has been a trend to eliminate component cases, which take up space, are not essential, and create unnecessary costs. Various constructions and methods have been developed to solve this problem.

One known solution is flip-chip (FC) technology, in which non-packaged semiconductor components are installed and connected directly to the surface of the circuit board. However, flip-chip technology has many weaknesses and difficulties. For example, the reliability of the connections can be a problem, especially in applications, in which mechanical stresses arise between the circuit board and the semiconductor component. In an attempts to avoid mechanical stresses, a suitable elastic underfill, which equalizes mechanical stresses, is added between the semiconductor component and the circuit board. This procedural stage slows down the manufacturing process and increases costs. Even the thermal expansion caused by the normal operation of a device may cause mechanical stresses large enough to compromise the long-term reliability of an FC structure.

US patent publication 4 246 595 discloses one solution, in which recesses are formed in the installation base for the components. The bottoms of the recesses are bordered by an insulation layer, in which holes are made for the connections of the component. After this, the components are embedded in the recesses with their connection zones facing the bottom of the recess, electrical contacts being formed to the components through the holes in the insulation layer. In such a method, problems can arise, for instance, when aligning the feed-throughs with the contact zones of the component. This is because the feed-throughs must be aligned relative to components lying under the insulation layer. In other ways too, the method does not correspond to the technology used nowadays (the patent dates from 1981).

JP application publication 2001-53 447 discloses a second solution, in which a recess is made for the component in the installation base. The component is placed in the recess, with the component's contact zones facing towards the surface of the installation base. Next, an insulation layer is made on the surface of the installation base and over the component. Contact openings for the component are made in the insulation layer and electrical contacts are made to the component, through the contact openings. In this method too, the alignment of the feed-throughs with the contact zones of the component can cause problems, as the alignment must be made relative to a component lying under the insulation layer. In the method, considerable accuracy is demanded in manufacturing the recess and setting the component in the recess, so that the component will be correctly positioned, to ensure the success of the feed-throughs, relative to the width and thickness of the installation board.

In general too, the connection of components through feed-throughs made in the insulation layer creates a challenge to techniques, in which an attempt is made to embed components inside a circuit board or other installation base. Problems can arise, for example, due to the alignment precision, the stress created on the surface of the component by the manufacture of the hole, and by the covering of the edge areas of the feed-through by conductive material. Even a partial reduction of the problems relating to feed-throughs would be beneficial to the low-cost manufacture of reliable electronic modules that include unpackaged components embedded in an installation base. On the other hand, embedding a component inside an installation base will allow the construction to better withstand mechanical stress, which has been a problem in flip-chip technology.

The invention is intended to create a new single-layer component package.

According to an aspect of the invention, there is provided a single-layer component package, comprising: a single conductive-pattern layer having a first surface; an insulating-material layer on the first surface of the single conductive-pattern layer; in an installation cavity inside the insulating-material layer, a semiconductor component having flat contact zones; and solid contact pillars containing copper and solderlessly, metallurgically and electrically connecting the flat contact zones to the single conductive-pattern layer.

According to another aspect of the invention, there is provided a single-layer component package, comprising: a single conductive-pattern layer having a first surface and comprising a first conductive material extending throughout the single conductive-pattern layer; a semiconductor component having flat contact zones facing the single conductive-pattern layer; an insulating-material layer extending on the first surface of the single conductive-pattern layer and at least partly embedding the semiconductor component; and solid contact bumps solderlessly, metallurgically and electrically connecting the flat contact zones to the single conductive-pattern layer via said local surfacing, the solid contact bumps containing copper.

According to a further aspect of the invention, there is provided a single-layer component package, comprising: a single conductive-pattern layer comprising a first conductive material extending throughout the single conductive-pattern layer; a semiconductor chip having contact pads facing the single conductive-pattern layer; an insulating-material layer supporting the single conductive-pattern layer and surrounding the semiconductor chip; and solid contact bumps solderlessly, metallurgically and electrically connecting the contact pads to the single conductive-pattern layer, at least part of each solid contact bump made of copper.

Considerable advantages are gained with the aid of embodiments of the invention. This because it is possible, with the aid of the embodiments, to embed unpackaged components in an installation base, reliably and economically.

Because the components can be embedded inside the installation base, in preferred embodiments it is possible to achieve a reliable and mechanically durable construction.

With the aid of the embodiments, it is also possible to reduce the number of the problems that appear in the prior art, which are caused by the feed-throughs relating to connecting the components. This is because in the embodiments, in which there is no need at all to make feed-throughs, the components being instead connected, already in the installation stage, to the conductor membrane, from which the conductors leading to the components of the electronic module are made.

In the embodiments, the components, of which there may be one or several, are installed on their installation base, such as a circuit board, during the manufacture of the base, so that the base structure, is as it were, manufactured around the component. The components become embedded and attached as desired to this base structure.

In the embodiments, it is thus possible to manufacture a circuit board, inside which components are embedded. There are also embodiments, with the aid of which a small and reliable component package can be manufactured around a component, as part of the circuit board. In such embodiments, the manufacturing process is simpler and cheaper that manufacturing methods in which separate cased components are installed and connected to the surface of the circuit board. The manufacturing method can also be applied to use the method to manufacture Reel-to-Reel products. Thin and cheap circuit-board products containing components can be made by using the methods according to the preferred embodiments.

There are also many other preferred embodiments, which can be used to obtain significant additional advantages. With the aid of such embodiments, a component's packaging stage, the circuit board's manufacturing stage, and the assembly and connecting stage of the components, for example, can be combined to form a single totality. The combination of the separate process stages brings significant logistical advantages and permits the manufacture of small and reliable electronic modules. A further additional advantage is that such an electronic-module manufacturing method can mostly utilize known circuit-board manufacturing and assembly technologies.

The composite process according to the embodiment referred to above is, as a totality, simpler that manufacturing a circuit board and attaching a component to the circuit board using, for example, the flip-chip technique. By using such preferred embodiments, the following advantages are obtained, compared to other manufacturing methods:

Soldering is not needed in the connections of the components, instead an electrical connection between the connection zones on the surface of the component and the metal membrane of the installation base is created, for example, by ultrasonic welding, thermo-compression, or some other such method, in which the temperatures required to achieve electrical connections, though high, are of short duration and local, and in which high temperatures are not required over a wide area. This means that the connection of a component does not need metal being maintained molten for a long time with its associated high temperature. Thus, the construction is made more reliable than soldered connections. Particularly in small connections, the brittleness of the metal alloys create large problems. In a solderless solution according to a preferred embodiment, it is possible to achieve clearly smaller constructions than in soldered solutions. The manufacturing method can even be designed so that, during the connection process of a component, heat is brought only to the area of the connection, so that the areas most strongly heated are the connection zone of the component and the area to which the component is connected. Elsewhere in the structure the temperature remains low. This gives greater freedom of choice when selecting the materials of the installation base and the components. If ultrasonic welding is used as the connection method, higher temperatures may only be required to harden the fillers used. Polymer membranes, which are hardened other than through the effect of heat, for example, chemically or with the aid of electromagnetic radiation, such as UV light, can also be used in the method. In such a preferred embodiment of the invention, the temperature of the installation base and components can be kept very low during the entire process, for example, at less than 100° C.

As smaller structures can be manufactured using the method, the components can be placed closer together. Thus, the conductors between the components also become shorter and the characteristics of the electronic circuits improve. For example, losses, interferences, and transit-time delays can be significantly reduced.

The method permits a lead-free manufacturing process, which is environmentally friendly.

When using a solderless manufacturing process, fewer undesirable intermetallics also arise, thus improving the long-term reliability of the construction.

The method also permits three-dimensional structures to be manufactured, as the installation bases and the components embedded in them can be stacked on top of each other.

There are also other preferred embodiments. For instance, flexible circuit boards can be used in connection with the embodiments. Further, in embodiments, in which the temperature of the installation base can be kept low during the entire process, organic manufacturing materials can be used comprehensively.

With the aid of the embodiments, it is also possible to manufacture extremely thin structures, in which, despite the thinness of the structure, the components are entirely protected inside their installation base, such as a circuit board.

In embodiments, in which the components are located entirely inside the installation base, the connections between the circuit board and the components will be mechanically durable and reliable.

The embodiments also permit the design of electronic-module manufacturing processes requiring relatively few process stages. Embodiments with fewer process stages correspondingly also require fewer process devices and various manufacturing methods. With the aid of such embodiments, it is also possible in many cases to cut manufacturing costs compared to more complicated processes.

The single-layer component package comprises only one conductive-pattern layer.

In embodiments, in which the conductor layer connected to a component is patterned only after the connection of the component, the conductor layer can include conductor patterns even at the location of the component. A corresponding advantage can also be achieved in embodiments, in which the electronic module is equipped with a second conductive-pattern layer, which is located on the opposite surface of the base material of the module (on the opposite surface of the insulation material layer relative to the conductive-pattern layer connected to the component). The second conductor layer can thus also include conductive patterns at the location of the component. The placing of conductive patterns in the conductor layers at the location of the component will permit a more efficient use of space in the module and a denser structure.

In the following, the invention is examined with the aid of examples and with reference to the accompanying drawings.

In the methods of the examples, manufacturing starts from an installation base 1 of an insulating substance, which is thicker than the components 6 that are later to be connected to the base. Of course, the method can also be applied in such a way that the installation base 1 and the component 6 are equally thick. In some embodiments, it is also possible to use components 6 that are thicker than the installation base 1. Using a suitable method, through-cavities 2, selected to suit the size of the components 6 to be installed, are made in the insulating material layer 1. The alignment of the components 6 also requires suitable alignment marks, to creation of which several different methods are available. One possible method is to make small through-holes 3 near to the installation cavities 2 of the components 6. The precise alignment of the component preferably requires at least two through-holes. An unpatterned metal film 4, which acts as the conducting surface of the installation base for the components 6 to be installed and connected, is made on the first surface 1a of the insulating substance layer 1. The metal film 4 can be manufactured, for example, by laminating copper (Cu). The metal film 4 can also be a surfaced metal film, or some other film including several layers or several materials. In some embodiments, for example, a copper film surfaced with a layer of tin or gold can be used. In these embodiments, the surfacing is typically made on the side of the insulating material layer 1. Another possible procedure is for the metal film 4 to include surfacing only in the area of the installation cavities 2.

The components 6 are aligned with their installation cavities 2 with the aid of the alignment holes 3, or some other alignment marks and the connection zones or contact protrusions 7 on the surface of the components 6 are connected to the metal film 4. The connecting can take place, for example, using the ultrasonic or thermo-compression methods.

The ultrasonic method then refers to a method, in which two pieces containing metal are pressed against each other while vibration energy at an ultrasound frequency is brought to the area of the joint. Due to the effect of the ultrasound and the pressure created between the surfaces to be joined, the pieces to be joined are bonded metallurgically. Methods and equipment for ultrasonic bonding are commercially available. Ultrasonic bonding has the advantage that a high temperature is not required to form a bond.

The terms metal layer, metal film, metal contact bump, metal contact zone, and in general a metal item, refer to the fact that the manufacturing material of the item contains enough of at least one metal for the item to form a metallurgical bond with another item. The item can naturally also include several metals as layers, accumulations, zones, or metal alloys. Possible metals include particularly copper, aluminium, gold, and tin.

The term thermo-compression method refers in turn to a method, in which two pieces containing metal are pressed against each other while thermal energy is brought to the area of the joint. The effect of the thermal energy and the pressure created between the surfaces to be joined cause the pieces to be joined to be bonded metallurgically. Methods and equipment for thermo-compression bonding are also commercially available.

In some embodiments, contact bumps 5, to which the connection zones or contact protrusions 7 of the components 6 are connected, are made on top of the conductive film 4. In such a method, the contact bumps 5 can also be used to align the components 6 during the components' installation stage. The components 6 can, of course, be aligned with the aid of other alignment marks, for example, the alignment holes 3, if such are made in the process being used. In embodiments using contact bumps 5, the procedure can otherwise correspond to embodiments in which contact bumps 5 are not used. The use of contact bumps 5 is justified, for example, if the material of the components' 6 contact zones or contact protrusions 7 is not directly suitable for connection to the selected material of the conducting layer 4. In that case, the material of the contact bumps 5 is selected to permit a bond using the bumps 5 to be created. In such embodiments, the contact bumps 5 are thus intended to match two different conductor materials to each other. For this purpose, the contact bump 5 can also be manufactured as a layered structure, containing two or more layers of possibly differing materials.

After the connection of the components 6, the space remaining in the installation cavity 2 around the component 6 is filled with a suitable filler 8, usually some kind of polymer filler. The filling is intended to secure the component 6 mechanically to the insulating material layer 1, thus achieving a mechanically more durable construction. The filler material 8 also supports the conductive patterns 14 to be formed later from the conducting layer 4 and protects the component and the bond between the component 6 and the conducting layer 4 during the formation of the conductive patterns 14. In principle, the securing of the component 6 is not, however, an essential operation, especially in embodiments, in which mechanical durability or a long life are not demanded of the structure.

The filler 8 can also be selected on the basis of other properties of the filler material and according to desired special functionalities of the component package. For example, the filler 8 can have optical properties such that it makes possible to achieve optical coupling between the embedded component and the environment around the package. Thus, the filler 8 can also be a so-called optical polymer.

In case the component 6 has a high power consumption, it may also be desirable the filler 8 to have a high thermal conductivity. Then, the filler 8 is selected such that it meets these requirements and can also contain particles enhancing thermal conductivity, for instance.

It is also possible that the filler material comes from the insulating material layer 1 and is not separately brought into the structure. For instance, when a suitable prepreg is selected as the insulating material layer 1, some of the material of the prepreg can be caused to flow in a lamination stage or other such compression stage to make contact with the surface of the component 6. For example, if the insulating material layer 1 first comprises epoxy material is a pre-hardened stage (B-stage), in can be caused to flow so as to form also the filler 8 around the component 8.

If desired, a conductive film 9, from which conductive patterns 19 can be formed later, can also be made on the second surface 1b of the insulating material layer 1. The conductive film 9 can be manufactured in a manner corresponding to that of the conductive film 4 made of the first surface 1a of the base. The manufacture of a second conductive film 9 is not, however, necessary in simple embodiments and when manufacturing simple electronic modules. A second conductive film 9 can, however, be exploited in many ways, such as additional space for conductive patterns and to protect the components 6 and the entire module against electromagnetic radiation (EMC shielding). With the aid of a second conductive film 9 the structure can be reinforced and warping of the installation base, for example, can be reduced.

The manufacturing processes according to the examples can be implemented using manufacturing methods, which are generally known to those versed in the art of manufacturing circuit boards.

In the following, the stages of the method shown in FIGS. 1-8 are examined in greater detail.

Figure 1:
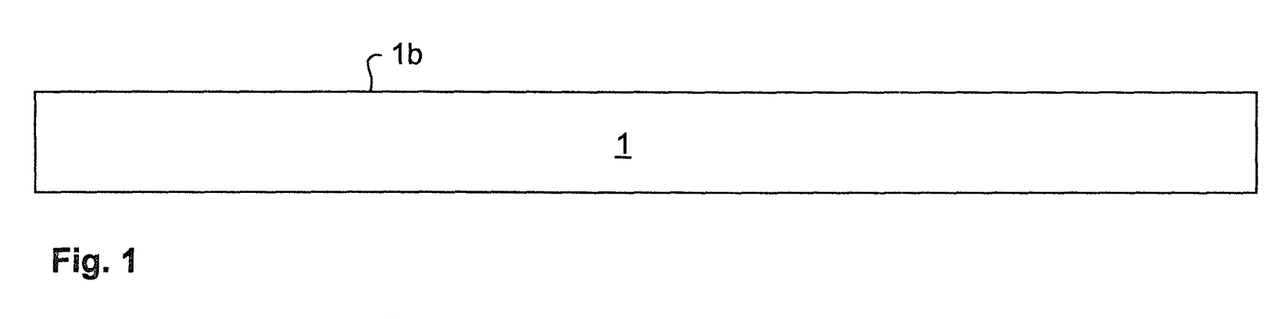
FIGS. 1-8 show a series of cross-sections of some examples of manufacturing methods by means of which it is possible to manufacture an electronic module according to an embodiment of the invention, and schematic cross-sectional diagrams of some electronic modules according to embodiments of the invention.

Stage A (FIG. 1):

In stage A, a suitable sheet 1 of insulating-material board, from which the body of the installation base is formed, is selected for the manufacturing process of the electronic module. The insulating-material layer 1 should preferably be thicker than the component to be installed. The component can then be embedded entirely inside the installation base while the electronic module will be even on both surfaces. Of course, thicker special components can also be embedded into the installation base, their rear surface protruding outside the second surface 1b of the insulating-material layer 1. This can be done particularly if it is not intended to stack a second electronic module on top of the electronic module being manufactured. In terms of the durability of the construction, however, it would be preferable for the components to be embedded entirely inside the installation base.

The insulating-material layer 1 can be, for example, a polymer base, such as a glass-fibre reinforced epoxy sheet FR4. In embodiments in which high temperatures are not needed in the manufacturing process, the installation base 1 can also be a cheap and flexible organic sheet. Other examples of suitable materials for the insulating-material layer 1 are PI (polyimide), FR5, aramide, polytetrafluoroethylene, Teflon®, and LCP (liquid crystal polymer).

Figure 2:
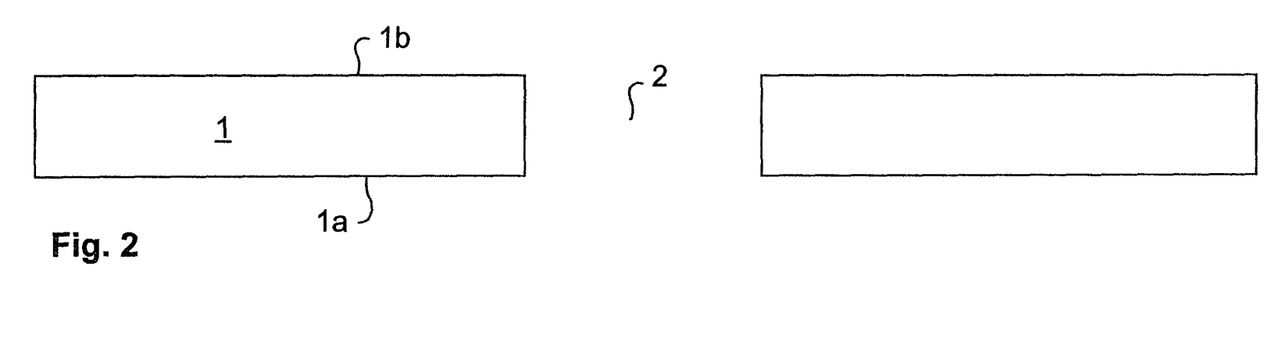
Figure 3A:
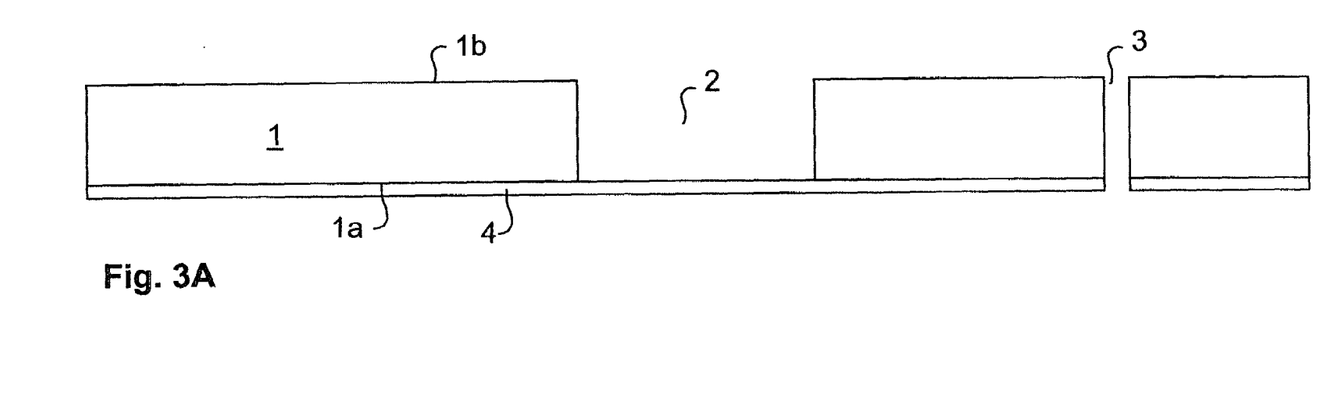
Figure 3B:
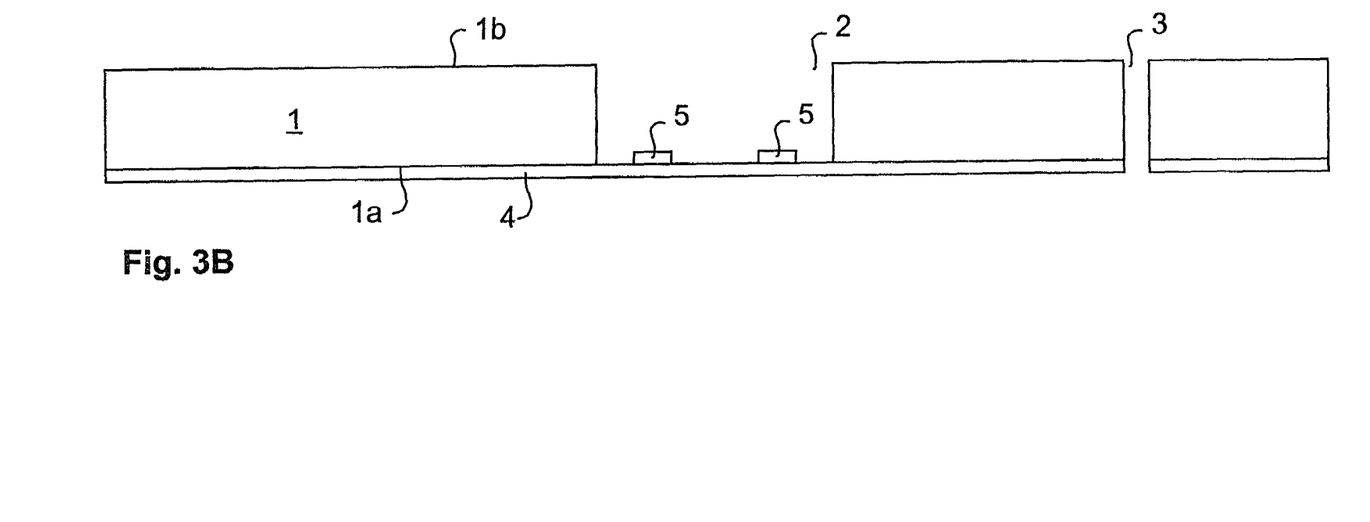

Stage B (FIG. 2):

In stage B, through-cavities 2 of a suitable size and shape for the components to be embedded in the sheet are made in the insulating-material layer 1. The cavities 2 can be made suitably, for example, using some known method used in circuit-board manufacture. The cavities 2 can be made, for example, mechanically by milling, impact, drilling, or with the aid of a laser. The cavities 2 extend through the entire insulating-material layer 1, from its first surface 1a to its second surface 1b. If several of the cavities 2 are made, they are positioned relative to each other within the highest limits of accuracy possible for the manufacturing method being used.

Stage C (FIGS. 3A and 3B):

The example series of figures shows two alternative stage Cs. According to a modification of the example process A (FIG. 3A), in stage C a thin conductive film 4, or more generally a conducting layer 4 is attached to the second surface 1b of the insulating-material layer 1. The conductive film 4 is typically a metal film 4. In several embodiments, a suitable metal film is a copper (Cu) film, though other metals and also metal alloys can very well be used. The copper film can be attached to the insulating-material layer 1, for example, by lamination. An adhesive layer, which is spread on the surface of the insulating-material layer 1 or of the conductive film 4 prior to laminating the conductive film 4, can be used to aid the attachment of the conductive film 4. In the example processes, patterns have not yet been made in the conductive film 4 at this stage, so that there is no need to particularly align the film 4 relative to the insulating-material layer 1. During, or after the attaching of the conductive film 4, through-holes 3, which can be used later to align the components in the component installation stage, can also be made in the installation base. However, it is not essential to make through-holes 3, as instead other suitable alignment marks can be used to align the components. If through-holes 3 are made, it would be best for there to be at least two of them in the installation base. It is also possible to proceed so that two through-holes 3 are made for each component to be installed. In the embodiment shown in the figures, the through-holes 3 used to align the components extend through both the insulating-material layer 1 and the conductive film 4. This has the advantage that the same alignment marks (the through-holes 3) can be used for alignment on both sides of the installation base.

In stage C of the B modification of the example process (FIG. 3B), the procedure is mainly the same as is the A modification, except that, in addition to the stages shown in the A modification, in the B modification contact bumps 5 are made on the surface of the conductive film 4. The contact bumps 5 can be made in the conductive film 4 prior to the attachment of the conductive film 4 to the insulating material layer 1. The contact bumps 5 are then aligned relative to each other, while in the attachment stage of the conductive film 4 the conductive film 4, together with the contact bumps, is aligned relative to the insulating-material layer 1 and particularly to the installation cavities 2 made in the insulating-material layer 1. A second alternative is to first attach the conductive film 4 to the insulating-material layer 1 and after this make the contact bumps 5 on the bottom of the installation cavities 2. The contact bumps 5 are intended to connect a component to be installed later to the conductive film 4. In the example process, the contact bumps 5 are manufactured from some metallurgically compatible material, such as gold (Au). The contact bumps can be made using some process generally known in the circuit-board industry. If through-holes 3 are used in the process for alignment, they can be made in the same stage. The through-holes 3 can also be made after making the contact bumps 5, in which case they should be aligned as accurately as possible relative to the contact bumps 5, or else prior to manufacturing the contact bumps 5, in which case the contact bumps 5 are aligned relative to the through-holes 3.

Stage D (FIGS. 4A, 4B, and 4C):

Three modifications of Stage D are shown. In the A modification (FIG. 4A), a component 6, which includes contact bumps 7 in the connection zones of the component, is connected to the installation base. The contact bumps 7 of the component are connected to the conductive layer 4, so that an electrical contact is formed between the contact bump 7 and the conductive layer 4. It would be good for the connection to also withstand mechanical stress, so that the connection will not be easily broken in later process stages, or during the operation of the electronic module. The connection is formed using a suitable connection method, for example, the ultrasonic and thermo-compression methods. In the connection stage, the through-holes 3 made for alignment, or other available alignment marks are used to align the component 6.

In the B modification (FIG. 4B) too, a component 6, which includes contact bumps 7 in the connection zones of the component, is connected to the installation base. The difference to the A modification is that, in the B modification, contact bumps 5 are also formed on top of the conductive layer 4. The contact bumps 7 of the component are then connected to the contact bumps 5 of the installation base. The connection can, as in modification A, be formed using a suitable connection method, for example, the ultrasonic or thermo-compression methods. In the B modification, the component can be aligned, according to the embodiment, using the contact bumps 5, the through-holes 3, or other alignment marks suitable for alignment.

Figure 4A:
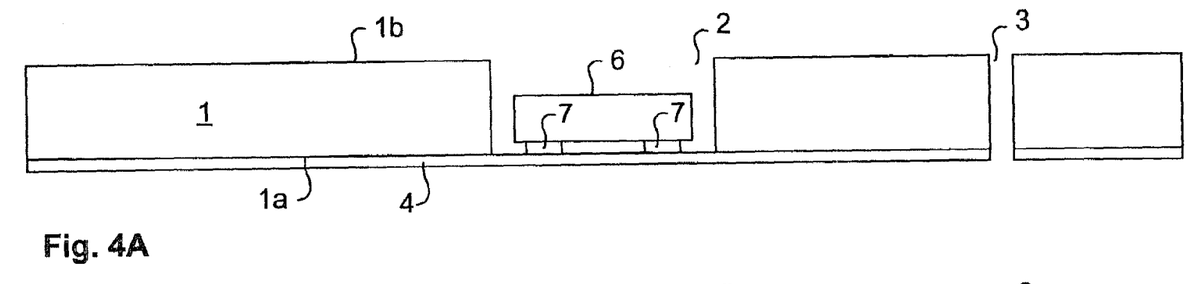
Figure 4B:
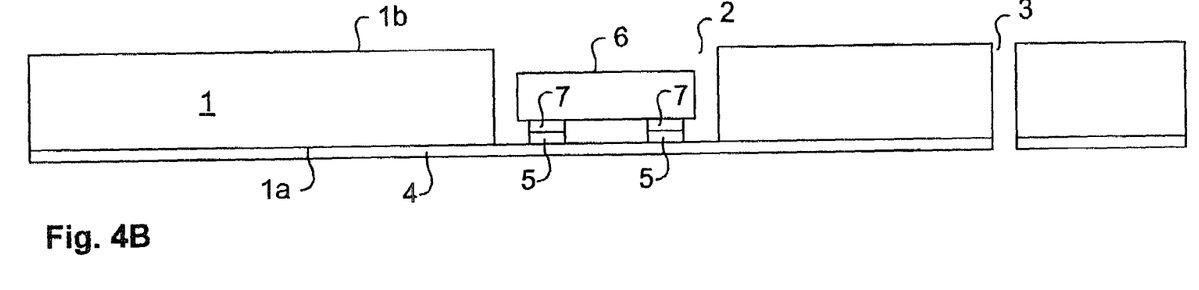
Figure 4C:
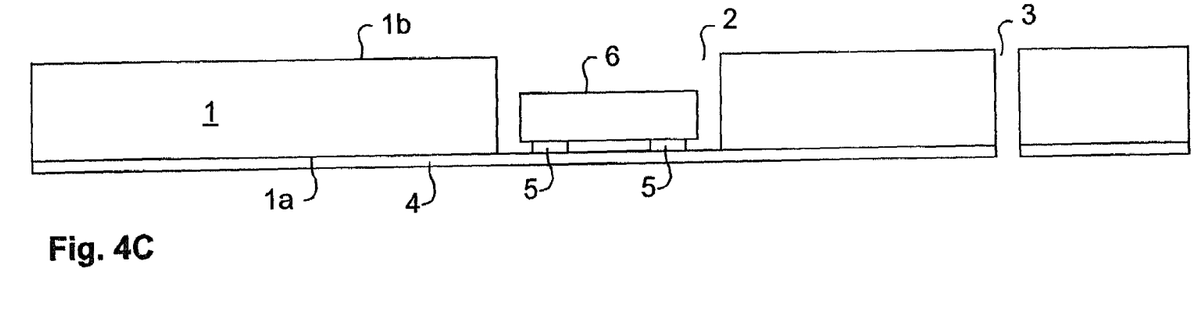

In the C modification of the example process, as in the B modification, an installation base is used, in which contact bumps 5 are made on top of the conductor layer 4. Unlike in the A and B modifications, in the C modification a component 6 is used, the surface of which has flat contact zones, but no actual contact bumps 7, or other corresponding contact protrusions. In the C modification, connection and alignment are carried out as in the B modification, except that the connection is formed between the conductive material of the contact zones and the contact bumps 5 of the installation base.

Figure 5A:
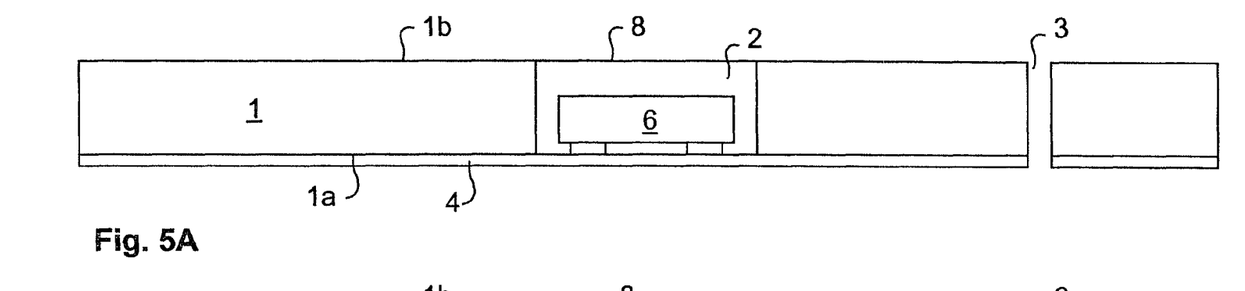
Figure 5B:
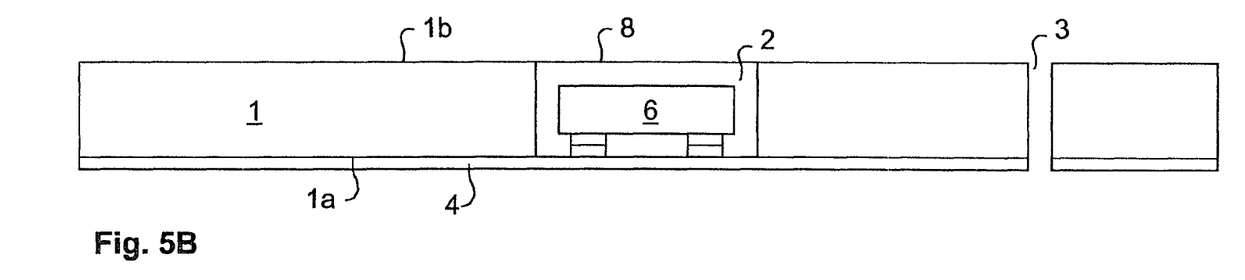
Figure 5C:
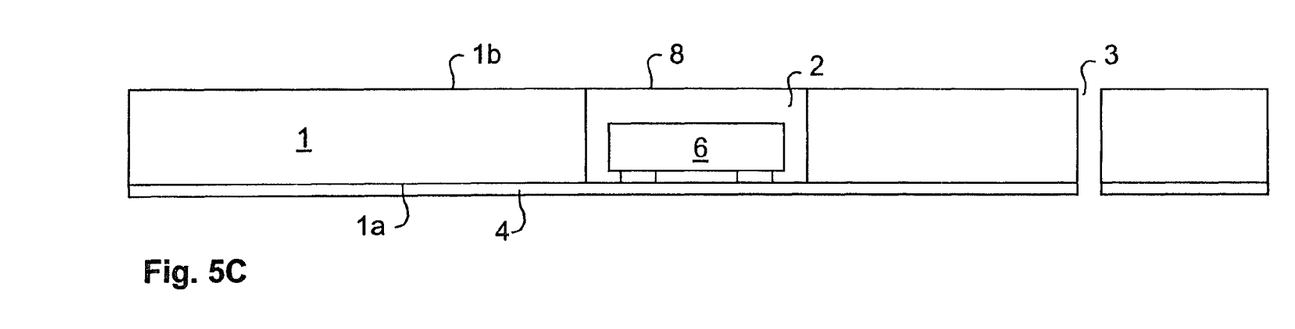

Stage E (FIGS. 5A, 5B, and 5C):

In stage E, the space remaining between the component 6 and the installation base is completely filled with a filler 8, which is, for example, some suitable polymer. For example, epoxy filled with suitable particles can be used as the polymer. The polymer can be spread using, for example, some known vacuum-paste-pressing device suitable for the task. FIGS. 5A, 5B, and 5C show the installation base after the attachment of a component, in A, B, and correspondingly C modifications of the process. The purpose of the filler 8 is to secure the component 6 mechanically to the insulating-material layer 1, so that the electronic module will better withstand mechanical stress. In addition, the filler 8 protects the component 6 during later process stages. Protecting the component 6 can be particularly beneficial in embodiments, in which conductive patterns are formed by etching the conductive layer 4 and in which the surface of the component 6 is sensitive to the effect of the etching agent used. Otherwise, the filling of the installation cavity 2 is in no way essential and, at least in some embodiments, stage E can be omitted or performed at a later stage in the process.

In some embodiments, the installation cavity 2 can be dimensioned to the size of the component 6, so that a friction fit is created between the component and the installation cavity 2, filler 8 then not being necessarily required. Such an embodiment is, however more challenging in terms of the manufacturing technology while the final result remains mechanically weaker than in the embodiments shown in FIGS. 5A, 5B, and 5C.

In embodiments, in which conductive patterns are formed on the second surface 1b of the insulating layer 1, the manufacture of the conductive patterns can be facilitated by evening the second surface 1b of the insulating layer 1, with the aid of a filler 8.

Figure 6A:
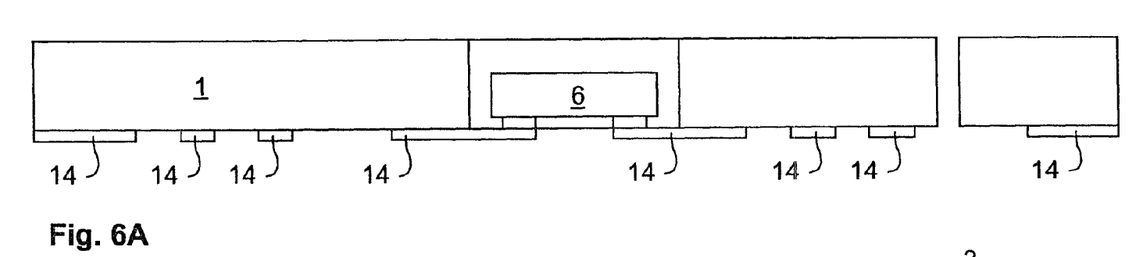
Figure 6B:
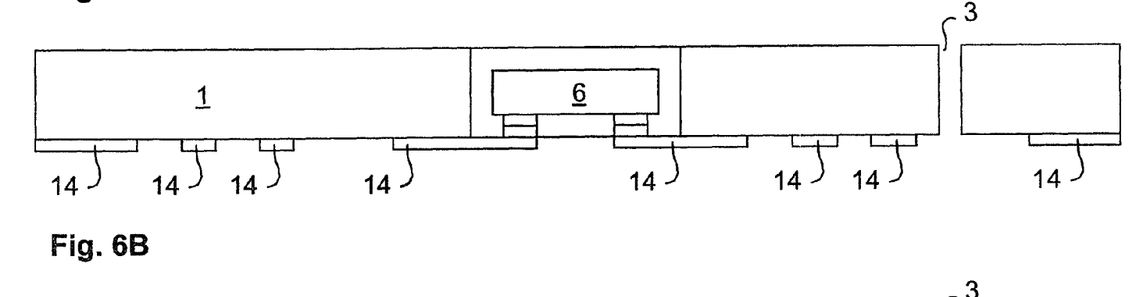
Figure 6C:
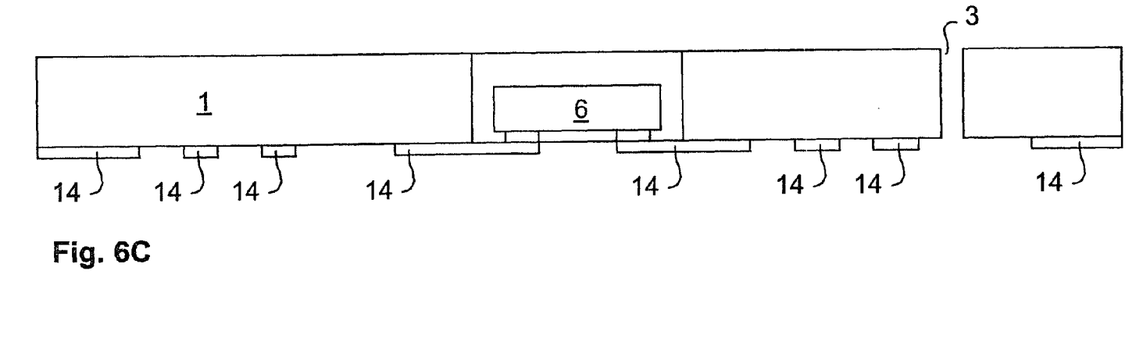

Stage F (FIGS. 6A, 6B, and 6C):

FIGS. 6A, 6B, and 6C show the electronic module after the carrying out of stage F, in modifications A, B, and C of the process, respectively. Stage F itself is, however, performed in the same way in each of these modifications. In stage F, conductive patterns 14 are formed from the conductive layer 4 using some suitable method. The conductive patterns 14 can be made, for instance, by removing the conductive material of the conductive layer 4 from outside of the conductive patterns. The conductive material can be removed, for example, using one of the selective etching methods that are widely used and well known in the circuit-board industry. If the conductive layer 4 is made from a special material, the conductive patterns 14 can also formed in such a way that the conductivity of the conductive material 4 is removed from outside of the conductive patterns, for example, with the aid of electromagnetic radiation. When using a conversely reactive material, the material is put into a conductive state in the area of the conductive patterns. Thus, the conductive layer 4 is, in the previous stages of the method, actually the insulating layer, which can be converted to be conductive with the aid of special treatment. The manner of forming the conductive patterns 14 is thus not, as such, essential to the manufacture of the electronic module.

The conductive patterns are aligned with the aid of alignment marks made in the installation base. The alignment marks can be the same that are used to align the components, or else separate alignment marks, which are made at a specific location relative to the alignment marks used in the alignment of the components. Because the components and conductive patterns are both aligned relative to the alignment marks on the installation base, they are thus also aligned relative to each other.

If through-holes 3 are made in the embodiment, the conductive patterns to be made can be aligned with the aid of the through-holes 3.

After stage F, the electronic module includes a component 6, or several components 6 and conductive patterns 14, with the aid of which the component or components 6 can be connected to an external circuit, or to each other. The conditions for manufacturing a functional totality then exist already. The process can thus be designed in such a way that the electronic module is already finished after stage F and FIGS. 6A, 6B, and 6C show examples of some possible electronic modules that can be manufactured using the example methods. Of course, if it is wished, the process can also continue after stage F, for example, by making conductive patterns on the second surface 1b of the insulating layer 1, or by surfacing the electronic module with a protective substance.

Figure 7A:
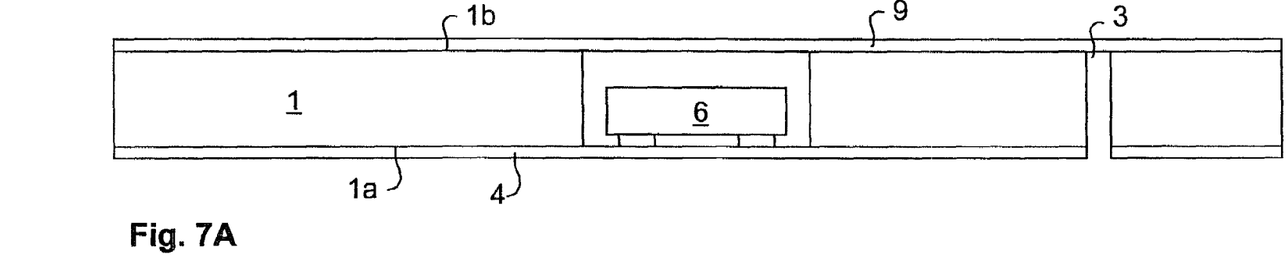
Figure 7B:
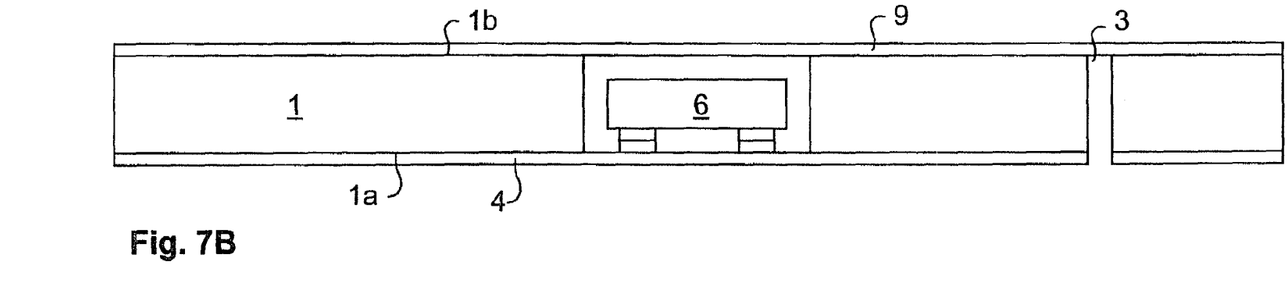
Figure 7C:
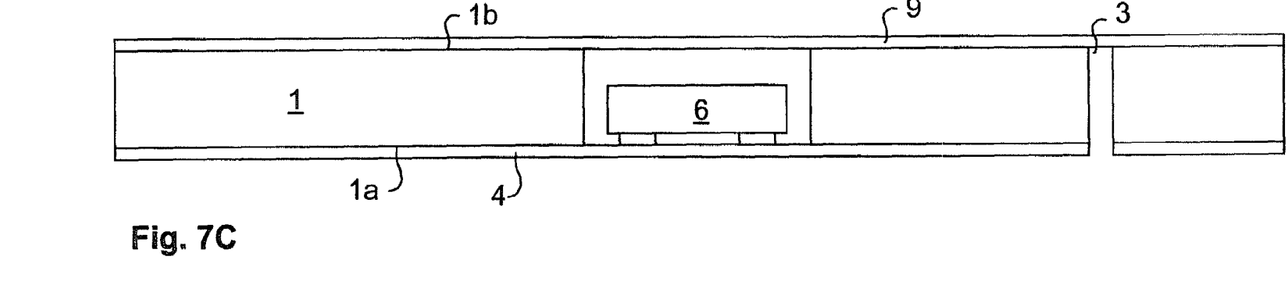

Stage G (FIGS. 7A, 7B, and 7C):

FIGS. 7A, 7B, and 7C show embodiments of the manufacturing process as A, B, and C modifications, in which, after stage E, a conductive layer 9 is formed on the second surface 1*b* of the insulating layer 1. In the embodiments shown in FIGS. 7A, 7B, and 7C, stage F is thus omitted, the method moving to stage G directly from stage E.

Stage G corresponds to stage C, in which a conductive layer 4 is made on the first surface 1*a* of the insulating layer 1. As in stage C, the conductive layer 9 can be made, for example, by laminating, on the second surface 1*b* of the insulating layer 1, a type of electrically-conductive film 9 corresponding to the one on the first surface 1*a*. The lamination can exploit an adhesive spread on the surface of the base or film, and which during the lamination stage attaches the installation base and the electrically-conductive film to each other.

Figure 8A:
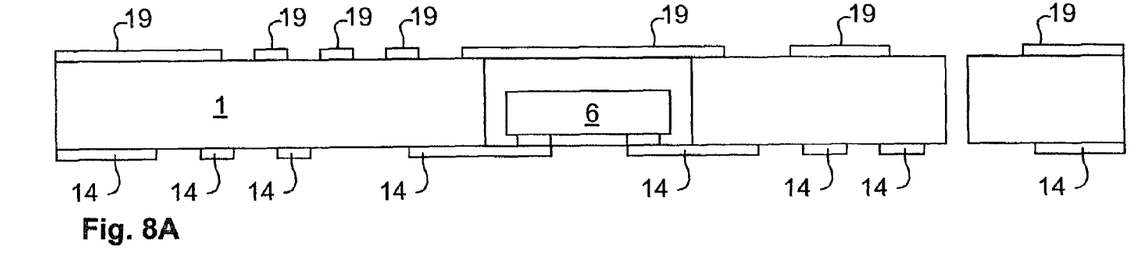
Figure 8B:
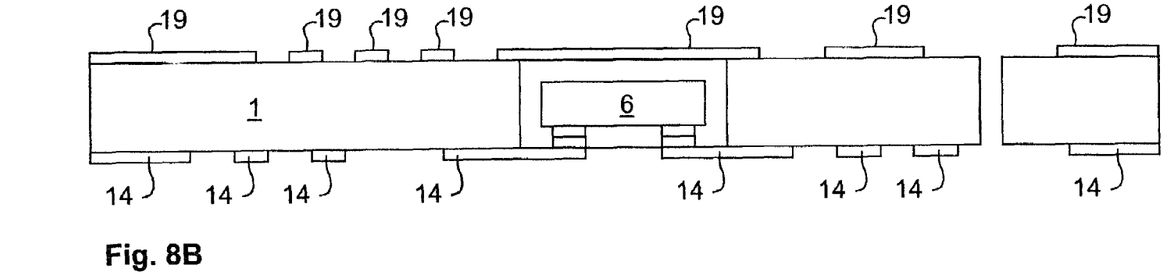
Figure 8C:
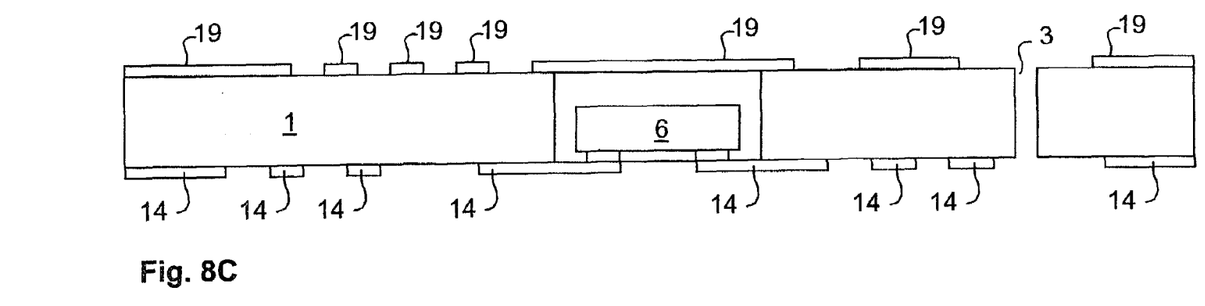

Stage H (FIGS. 8A, 8B, and 8C):

Stage H can be carried out after stage G, if it is wished to pattern the conductive layer 9 formed on the second surface 1*b* of the insulating layer 1. Stage H corresponds to stage F, with the difference that, in stage H, in addition to the conductive patterns 14, other conductive patterns 19 are formed from the conductive layer 9 made on the second surface 1*b* of the insulating layer 1. After carrying out stage H, the electronic module will include conductive patterns on both surfaces of the insulating-material layer 1. The second conductive-pattern layer will provide more diverse connection possibilities between the components 6. FIGS. 8A, 8B, and 8C show the electronic module after the carrying out of stage H, respectively in A, B, and C modifications of the process. Stage F itself is, however, carried out in the same way in each of these modifications.

After stage H, the electronic module includes a component 6, or several components 6 and conductive patterns 14 and 19. The examples of FIGS. 8A, 8B, and 8C show some possible electronic modules that can be manufactured using the example methods. If desired, the process can continue after stage H, for example, by making a feed-through, or feed-throughs, with the aid of which suitable points in the conductive pattern 14 can be connected electrically to suitable parts of the conductive pattern 19. The electronic module can also be surfaced with a protective substance.

Figure 9:
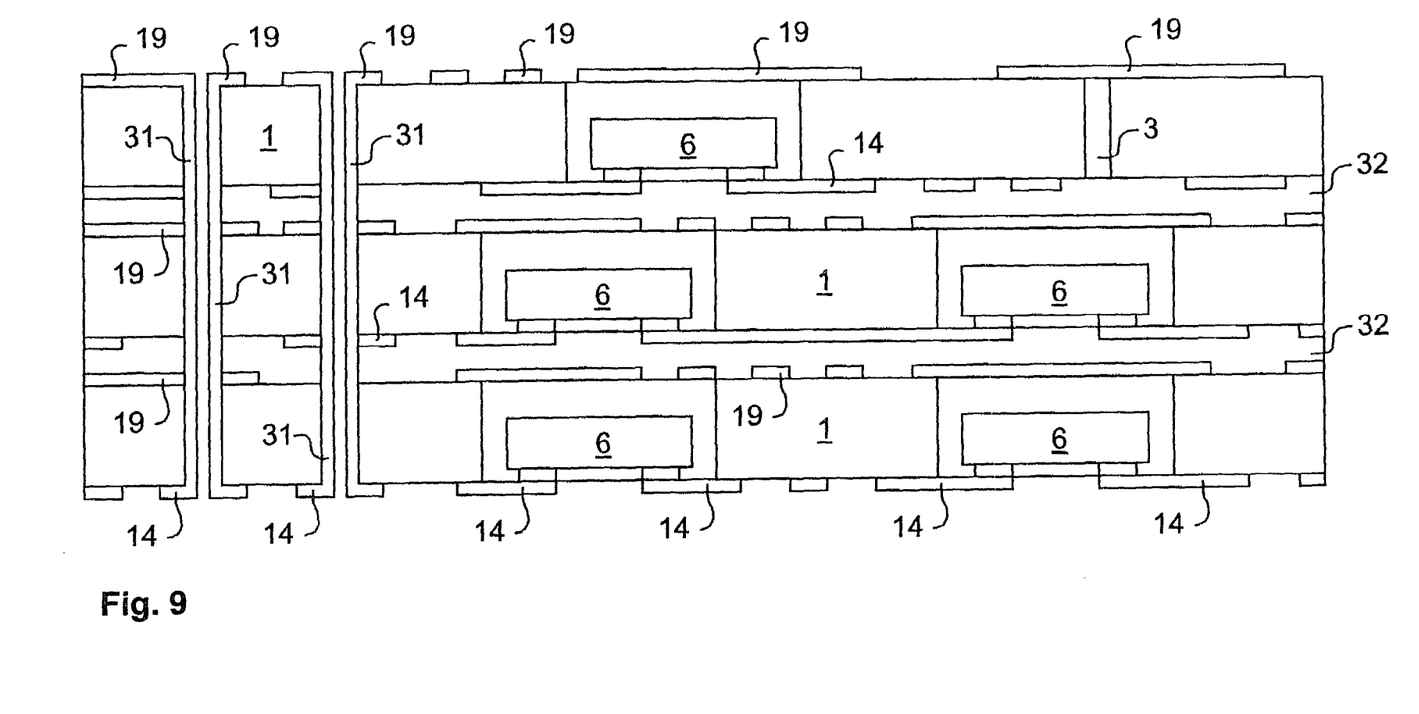
FIG. 9 shows a cross-sectional view of an electronic module according to an embodiment of the invention, which includes several installation bases on top of each other.

FIG. 9

FIG. 9 shows a multi-layered electronic module, which includes three installation bases 1 laminated on top of each other, together with their components 6, and a total of six conductive-pattern layers 14 and 19. The installation bases 1 are attached to each other with the aid of intermediate layers 32. The intermediate layer 32 can be, for example, a pre-preg epoxy layer, which is laminated between the installation bases 1. After this, holes running through the module are drilled in the electronic module, in order to form contacts. The contacts are formed with the aid of a conductive layer 31 grown in the holes. With the aid of the conducts 31 running through the electronic module, the various conductive-pattern layers 14 and 19 of the installation bases 1 can be suitably connected to each other, thus forming a multi-layered functioning totality.

On the basis of the example of FIG. 9, it is clear that the method can also be used to manufacture many different kinds of three-dimensional circuit structures. The method can be used, for example, in such a way that several memory circuits are placed on top of each other, thus forming a package containing several memory circuits, in which the memory circuits are connected to each other to form a single functional totality. Such packages can be termed three-dimensional multichip modules. In modules of this kind, the chips can be selected freely and the contacts between the various chips can be easily manufactured according to the selected circuits.

The sub-modules (installation bases 1 with their components 6 and conductors 14 and 19) of a multi-layered electronic module can be manufactured, for example, using one of the electronic-module manufacturing methods described above. Some of the sub-modules to be connection to the layered construction can, of course, be quite as easily manufactured using some other method suitable for the purpose.

The examples of FIGS. 1-9 show some possible processes, with the aid of which embodiments of our invention can be exploited. Our invention is not, however, restricted to only the processes disclosed above, but instead the invention also encompasses various other processes and their end products, taking into account the full scope of the Claims and the interpretation of their equivalences. The invention is also not restricted to only the constructions and methods described by the examples, instead it is obvious to one versed in the art that various applications of our invention can be used to manufacture a wide range of different electronic modules and circuit boards differing greatly from the examples described above. Thus, the components and wiring of the figures are shown only with the intention of illustrating the manufacturing process. Thus, many alterations to and deviations from the processes of the examples shown above can be made, while nevertheless remaining within the basic idea according to the invention. The alterations can relate, for example, to the manufacturing techniques described in the different stages, or to the mutual sequence of the process stages.

With the aid of the method, it is also possible to manufacture component packages for connection to a circuit board. Such packages can also include several components that are connected electrically to each other.

According to an embodiment, the component package is a flexible package. In such an embodiment, the insulating layer of the package can comprise a flexible organic sheet or a plurality of such sheets.

The conductive patterns 14 can also be designed such that a plate-like structure is formed at the location of the component 6 in order to protect the component against electromagnetic interference, for instance. Such a plate is preferably connected to a conductor via which the plate can be connected to a ground potential. Now referring to FIG. 6C, the plate-like structure can be formed "under" the component 6 in the space remaining between the shown conductive patterns 14 that participate in conducting electrical signals to and from the component 6.

The packaged component can be an active component or a passive component. The packaged semiconductor component can also be a MEMS component (Micro-Electro-Mechanical System).

It is also possible that the filler 8 and insulating material layer 1 do not completely embed the component 6 but for instance, the back surface of the component 6 is exposed to the environment outside the filler 8 and insulating material layer 1.

In an embodiment, the thickness of the insulating-material layer is less than the thickness of the semiconductor component.

In another embodiment, the thickness of the insulating-material layer is equal to the thickness of the semiconductor component.

In a further embodiment, the thickness of the insulating-material layer is greater than the thickness of the semiconductor component.

Furthermore, the reader is reminded that the contact bumps according to the invention need not be solely, or contain at all, the ordinary contact bumps that are often prepared on the surface of the contact zones, or contact pads or lands as they are also sometimes called, of the component 6. Instead, the contact bumps within the meaning of the invention are any contact structures that solderlessly, metallurgically and electrically connect the flat contact zones of the component to the single conductive-pattern layer. With reference to FIGS. 4B and 4C it is stressed that the contact bumps within the meaning of the invention can contain or consist of contact bumps 5 prepared as parts of the conductor layer 4. In addition to such contact bump 5, the contact bump according to the invention can also comprise an ordinary contact bump 7 on the surface of the contact pads, which embodiment is shown in FIG. 4B.

In addition, as disclosed in FIGS. 3B to 6C, the contact bumps (bumps 5 and bumps 7, if any) are completely filled solid metal bumps. Thus, the contact bumps are not hollow structures, for instance. The solid bumps provide better electrical conductivity, for instance. Such completely filled contact bumps are also called contact pillars.

In one embodiment, the contact bumps connecting the flat contact zones of the component to the single conductive-pattern layer contain solely the contact bumps 5 prepared as parts of the conductor layer 4 and said contact bumps 5 are made of copper.

In another embodiment, the contact bumps connecting the flat contact zones of the component to the single conductive-pattern layer contain both the contact bumps 5 prepared as parts of the conductor layer 4 and contact bumps 7 prepared on the surface of the contact pads, and both of said contact bumps 5 and 7 are made of copper.

In a further embodiment, the contact bumps connecting the flat contact zones of the component to the single conductive-pattern layer contain both the contact bumps 5 prepared as parts of the conductor layer 4 and contact bumps 7 prepared on the surface of the contact pads, and said contact bumps 5 prepared as parts of the conductor layer 4 are made of copper. The contact bumps 7 prepared on the surface of the contact pads contain other metals such as nickel and may also include copper as one metal in a layer structure.

The contact pillars or contact bumps 5 can also be prepared as parts of the conductor layer 4 from the reverse side of the conductor layer 4. In such a method, contact holes are made in the conductor layer 4 and the contact pillars or contact bumps 5 are prepared via and in the contact holes. In such a method, the contact holes are conveniently prepared in context with the process stages equivalent to that shown in FIGS. 3A and 3B. The contact holes can be manufactured at the locations of the contact bumps 5, for example by the same method than is used to make the through-holes 3. In an embodiment, the contact holes are prepared using a UV laser. Thus, the making of the contact holes replace the making of the contact bumps 5 in FIG. 3B.

After making the contact holes, the component 6 can be secured to the conductor layer 4 by means of an adhesive layer, filler 8 or insulator layer 1. The component 6 is aligned such that the contact lands or contact bumps 7 of the component 6 face the contact holes. Then, there may be some polymer material left on the surface of the contact lands or bumps, which can be removed by means of a $CO_2$ laser, for instance. This polymer material to be removed is from the adhesive layer, filler 8 or insulator layer 1. Now, there are contact holes that extend from the reverse side of the conductor layer 4 up to the surface of the contact lands or contact bumps 7 of the component 6. The next process step is to fill these contact holes with a conductor material or a plurality of conductor materials in order to prepare the contact pillars or contact bumps that connect the contact zones or the component 6 solderlessly, metallurgically and electrically to the single conductive layer 4.

The filling of the contact holes is made using at least one chemical or electrochemical metallization method. In an embodiment, the filling is started with at least one chemical metallization process and then continues by means of an electrochemical metallization process until the contact holes are completely filled with a conductor material. After filling the contact holes, the structure basically corresponds to that shown in FIG. 5C.

At the moment of writing of the present application, the most commonly used conductor material in semiconductor processes is aluminium. Thus, the most common material of the contact zones of bumpless components too is aluminium. However, the most common material to be used in conductor-pattern layers is copper. As the copper to aluminium interface is somewhat problematic in view of reliability of the products made, it is preferable to use an intermediate layer between the copper and aluminium. The intermediate layer can include one or more layers manufactured from different materials, between the aluminium contact zone and the copper conductors of the electronics module. In the following, reference is made to a few possible intermediate-layer constructions that can be used in the above described contact pillars or contact bumps 5—or in the combination of contact bumps 5 and 7:

Intermediate-Layer Construction 1

First of all, a layer containing zinc is grown on the surface of the aluminium contact zones. The layer containing zinc manufactured by a zincate process does not grow on the polymer surfaces of the side walls of the contact hole. A layer of nickel, which does not grow at all or only poorly on a polymer surface, is grown by a chemical method on the surface of the layer containing zinc. A layer of copper is grown by a chemical method on the surface of the nickel. The copper grown by a chemical growing method can be made to grow reliably also on top of polymer, thus making the side walls of the contact holes conductive for later electrochemical growing.

Intermediate-Layer Construction 2

First of all, a layer containing zinc is grown on the surface of the aluminium contact zones. The layer containing zinc manufactured by a zincate process does not grow on the polymer surfaces of the contact hole. A layer of copper is grown by a chemical method on the surface of the layer containing zinc. The copper grown by a chemical growing method can be made to grow reliably also on top of polymer, thus making the side walls of the contact holes conductive for later electrochemical growing.

Intermediate-Layer Construction 3

First of all, a layer containing zinc is grown on the surface of the aluminium contact zones. The layer containing zinc manufactured by a zincate process does not grow on the polymer surfaces of the contact hole. A layer of nickel-aluminium, which does not grow on a polymer surface, is grown by a chemical method on the surface of the layer containing zinc. A layer of copper is grown by a chemical method on the surface of the nickel-aluminium. The copper grown by a chemical growing method can be made to grow reliably also on top of polymer, thus making the side walls of the contact holes conductive for later electrochemical growing.

Intermediate-Layer Construction 4

First of all, a layer containing zinc is grown on the surface of the aluminium contact zones. A layer of nickel-aluminium is grown by a chemical method on the surface of the layer containing zinc. A layer of nickel is grown by a chemical method on the surface of the nickel-aluminium and a layer of copper is grown by a chemical method on the surface of the nickel.

Intermediate-Layer Construction 5

First of all, a layer containing zinc is grown on the surface of the aluminium contact zones. A layer of nickel is grown by a chemical method on the surface of the layer containing zinc.

Intermediate-Layer Construction 6

A layer of nickel is grown by a chemical method on the surface of the aluminium contact zones, which grown nickel layer alone forms the intermediate layer.

Intermediate-Layer Construction 7

A layer of nickel is grown by a chemical method on the surface of the aluminium contact zones, and a layer of copper is grown by a chemical method on the surface of the nickel.

In the above examples of intermediate-layer constructions, the layer containing zinc contains, for example, about 80% zinc, about 16% copper, about 2-3% nickel, and about 2-3% iron. This is only one possible example of alloy ratios suitable for the application, so that the alloy ratios can, of course, vary according to the applications. In the above examples of intermediate constructions, the thickness of the layer containing zinc is less than 1 µm, usually as a single layer about 0.1 µm and as several layers, for example 0.3-0.4 µm. At its thinnest, the layer containing zinc can be about 5-10 nm after manufacture. When growing a layer containing nickel or nickel-aluminium on top of the layer containing zinc, at least some of the zinc atoms dissolve and are replaced with nickel atoms. In the finished circuit module, it can be possible for the layer containing zinc to be observable as mainly a concentration profile of zinc in the interface between the aluminium and the material of the next layer. The layer containing zinc need not necessarily be precisely limited in the final product, because the zinc can diffuse to the adjacent material layers, particularly in stages of the manufacturing process using higher temperatures.

In one preferred embodiment, the layer containing zinc is grown by a double zincate process. With a single zincate process, the zinc forms a non-uniform and uneven surface on top of the aluminium. The adhesion of a nickel layer grown on top of such a surface is weaker and is less suitable for use with small micro-via openings. The quality of the grown zinc surface can be significantly improved by using a double zincate process. Typically, in such a process, after the first zincate treatment, the layer containing zinc is stripped using nitric acid ($HNO_3$), after which a second layer containing zinc is coated. By means of the double zincate process, a tight and uniform layer containing zinc is obtained on the surface of the component's aluminium junction interface.

The thickness of the nickel-aluminium layer, for its part, can be, for example, 0.2-2 µm. The thickness of the nickel layer, on the other hand, can be, for example 0.5-20 µm, typically 2-10 µm. The layer thicknesses too are only examples of the possible layer thicknesses and other layer thicknesses can also be used.

In the embodiments, the electrochemically grown copper layer can have a thickness of, for example, 5-30 µm, typically 10-20 µm. The copper layer grown by a chemical growing method, for its part, is generally manufactured to be clearly thinner, and its thickness in the embodiments is, for example, 0.1-2 µm, typically 200-800 nm.

In the manufacturing methods described above, it is, of course, also possible to use intermediate-layer constructions and materials, for example tin, other than those referred to above. It is also possible to grown a nickel layer directly on the surface of the aluminium, for example, by alkali etching and flushing the surface after this with propan-2-ol and immediately after this coating with propan-2-ol at boiling point in a warm chemical nickel bath. In addition, the surface of the layer containing zinc could also be coated with chromium and gold on the surface of the nickel.

It is also possible that the material of the contact pads is copper. If a bumpless component is manufactured by a semiconductor process using copper conductors, the contact zone is copper. In that case, the intermediate layer can be manufactured directly from chemically grown copper, which forms a conductor surfacing also on the side walls of the contact hole. After this, the contact holes can be filled and the thickness of the conductor layer increased using an electrochemical copper-growing method.

The method can also be used to manufacture total electrical modules. The module can also be a circuit board, to the outer surface of which components can be attached, in the same way as to a conventional circuit board.

The invention claimed is:

1. A single-layer component package, comprising:
a single conductive-pattern layer having a first surface;
an insulating-material layer disposed on the first surface of the single conductive-pattern layer;
at least one installation cavity disposed within the insulating-material layer,
at least one semiconductor component disposed within said installation cavity and provided with flat contact zones, said contact zones defining solid contact pillars which contain copper and are solderlessly, metallurgically and electrically connected to the single conductive-pattern layer, and
wherein the single conductive-pattern layer is the only conductive-pattern layer within the single-layer component package.

2. The component package of claim 1, wherein the single conductive-pattern layer comprises:
a layer of first conductive material extending throughout the single conductive-pattern layer; and
a surface layer provided on the layer of first conductive material, wherein the surface layer is made of second conductive material different from the first conductive material and is present only in the area of the installation cavity.

3. The component package of claim 2, wherein the first conductive material is copper.

4. The component package of claim 1, wherein the semiconductor component is an unpackaged memory circuit or an unpackaged microprocessor chip.

5. The component package of claim 1, comprising a plurality of semiconductor components disposed within the insulating-material layer, each of the semiconductor components having flat contact zones which are solderlessly, metallurgically and electrically connected to the single conductive-pattern layer via said contact pillars.

6. The component package of claim 1, comprising a conductive film for protecting the single-layer component package against electromagnetic radiation.

7. The component package of claim 1, wherein the solid contact pillars comprise a layer of at least one of zinc and nickel.

8. The component package of claim 1, wherein the insulating-material layer comprises a glass-fiber reinforced epoxy sheet.

9. The component package of claim 1, wherein the component package is flexible and the insulating-material layer comprises a flexible organic sheet.

10. The component package of claim 1, wherein the solid contact pillars contain a structured layer of copper and at least a second metal other than copper.

11. The single-layer component package of claim 1, wherein the contact zones are bonded through ultrasonic or thermo-compression bonding to the single conductive-pattern layer.

12. The single-layer component package of claim 1, wherein the contact zones are bonded chemically or through electromagnetic radiation to the single conductive-pattern layer.

13. A single-layer component package, comprising:
- a single conductive-pattern layer having a first surface and containing a first conductive material extending throughout the single conductive-pattern layer;
- a semiconductor component having flat contact zones facing the single conductive pattern layer;
- an insulating-material layer extending on the first surface of the single conductive-pattern layer and at least partly embedding the semiconductor component;
- solid contact bumps solderlessly, metallurgically and electrically connecting the flat contact zones to the single conductive-pattern layer via local surfacing, the solid contact bumps containing copper, and
- wherein the single conductive-pattern layer is the only conductive-pattern layer within the single-layer component package.

14. The component package of claim 13, wherein the semiconductor component has a rear surface on the opposite side from the single conductive pattern layer, the rear surface being at least partly exposed and not covered by the insulating material layer.

15. The component package of claim 13, wherein the component package is flexible.

16. The component package of claim 13, wherein the solid contact bumps comprise a layer of at least one of zinc and nickel.

17. The component package of claim 13, comprising a plurality of semiconductor components disposed within the insulating-material layer, each of the semiconductor components having flat contact zones which are solderlessly, metallurgically and electrically connected to the single conductive-pattern layer via said contact bumps.

18. The component package of claim 17, wherein at least one of the semiconductor components is an unpackaged semiconductor chip.

19. The component package of claim 13, wherein the insulating material layer.
- comprises at least one glass-fiber reinforced epoxy sheet and a filler which secures the semiconductor component mechanically to said at least one glass-fiber reinforced epoxy sheet.

20. A single-layer component package, comprising:
- a single conductive-pattern layer comprising a first conductive material extending throughout the single conductive-pattern layer;
- a semiconductor chip having contact pads facing the single conductive-pattern layer;
- an insulating-material layer supporting the single conductive-pattern layer and surrounding the semiconductor chip; and solid contact bumps solderlessly, metallurgically and electrically connecting the contact pads to the single conductive-pattern layer, at least part of each solid contact bump being made of copper, and
- wherein the single conductive-pattern layer is the only conductive-pattern layer within the single-layer component package.

21. The component package of claim 20, wherein the semiconductor chip is an unpackaged chip with an outer surface; and the insulating-material layer comprises at least one glass-fiber reinforced epoxy sheet and a filler securing the outer surface of the semiconductor chip mechanically to the at least one glass-fiber reinforced epoxy sheet.

22. The component package of claim 20, wherein the single conductive-pattern layer further comprises a local surface defining a connection area on the first conductive material, the local surface comprising a second conductive material, wherein the first conductive material is copper and the second conductive material is a metal other than copper.

* * * * *